Aug. 16, 1966 D. P. SANDERS 3,267,014
PROCESS FOR RAPIDLY ETCHING A FLAT-BOTTOMED PIT IN A GERMANIUM WAFER
Filed July 11, 1963
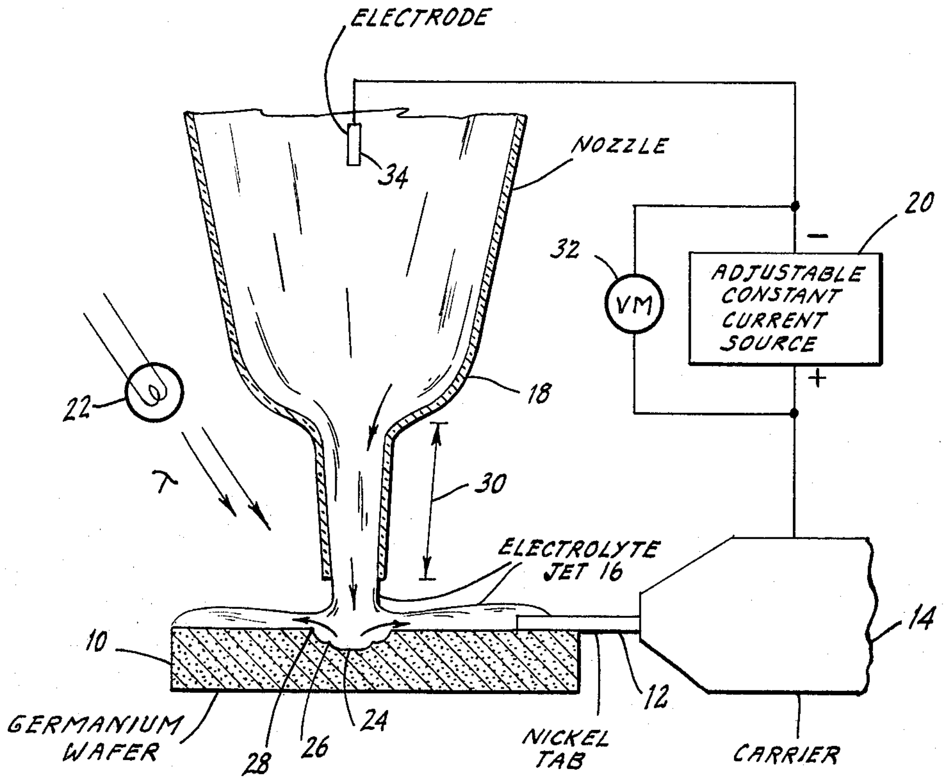
INVENTOR.
DONALD P. SANDERS
BY
Robert D. Sanborn
ATTORNEY 3,267,014

PROCESS FOR RAPIDLY ETCHING A FLAT-BOTTOMED PIT IN A GERMANIUM WAFER

Donald P. Sanders, Lansdale, Pa., assignor to Philco Corporation, Philadelphia, Pa., a corporation of Delaware Filed July 11, 1963, Ser. No. 294,383
4 Claims. (Cl. 204—143)

This invention relates to a method for the production of semiconductor devices, and more particularly to a new and improved process for jet etching pits in semiconductor blanks.

The jet etching process, described, for example, in 41 Proc. IRE 1706–8 (1953) and U.S. Patent 3,067,114, has achieved widespread recognition due the success achieved therewith in etching pits in semiconductor blanks to be used in the fabrication of transistors. Briefly, according to the process, a jet of electrolyte is directed against the face of a semiconductor wafer with an etching potential being applied across the wafer and the solution supplying the jet. The etching potential removes material from an area of wafer slightly larger than the diameter of the jet, and the jet cools the wafer and carries away the products of the electrolytic reaction. Etching of N-type wafers can be aided by shining light on the wafer to increase the supply of charge carriers (holes) therein when the jet current density is too high for the available supply of holes in the wafer.

In order to fabricate the complete transistor, two opposed pits are normally etched, one on each face of the wafer, and emitter and collector regions are formed in the opposed pits. For fabricating good transistors it is important that the etched pits have flat rather than curved (bowl or mound shaped) bottoms in order that the collector and emitter areas may have uniform separation. Since the jet etching process is normally performed on automatic machinery involving a considerable capital outlay, it is also highly important that the pits be etched as rapidly as possible.

Heretofore it was possible to etch rapidly flat pits in N-type wafers; this rendered operation of the automatic production line profitable. With the advent of the need to etch pits rapidly in P-type wafers it was found that the etching parameters which were used in conjunction with N-type wafers produced only bowl-bottomed pits in their opposite-conductivity counterparts. Since it was found that excess light (i.e., enough light to create more holes in the wafer than are necessary for the anodic removal of germanium at the surface of the wafer) also produced bowl-bottomed pits when N-type wafers were etched under the same conditions, the bowl-bottomed pits in the P-type wafers were attributed to the excess supply of holes inherently present in P-type material. However despite experimental variation of all the normally critical parameters involved in the etching process, the desired flat bottomed etch pits in the P-type material could not be rapidly etched.

Accordingly, several objects of the present invention are: (1) to provide a method for rapidly etching flat-bottomed pits in P-type germanium wafers, and (2) to provide a method for etchings pits in P-type germanium wafers which renders operation of an automated production line feasible. Another object of the present invention is to provide an improved method for etching pits in N-type germanium wafers.

*Summary*

According to the present invention pits are etched in germanium wafers by utilizing an electrolyte of a specified formula together with light and a critical jet-to-blank spacing.

The single figure of drawing shows a diagram of the apparatus utilized in the jet etching process.

*Description*

Reference is made to the drawing wherein is illustrated a sectional view of jet etching apparatus and a germanium wafer undergoing etching. In the drawing, wherein elements are not necessarily drawn to the same scale; 10 denotes a germanium wafer undergoing jet etching, 12 a base mounting tab soldered onto the wafer, 14 a carrier or mounting device for holding the tab and wafer in precise physical position under a jet nozzle, 16 the electrolyte, 18 the jet nozzle for supplying the electrolyte, 20 a variable constant current source for supplying operating potential of the polarity indicated to the system, and 22 a source for supplying light to the wafer. Since most mechanical aspects of the jet etching process are well known to those skilled in the art, many details nonessential for purposes of the present explanation have been omitted from the drawing. It should be noted that the process is normally carried out automatically on a mechanized production line with nozzle 18 maintained in a fixed position and successive carriers such as 14, each with a wafer mounted thereon, being automatically inserted, etched, and removed from under nozzle 18. The pit 24 is usually etched in one face of the wafer and the entire carrier may be removed, rotated 180°, and placed under a new nozzle for etching of a similar pit on the opposite face of the wafer according to one preferred automated etching procedure.

As can be seen by the cross-sectional view of pit 24, it has a substantially flat bottom. The pit's sides however are not flat or straight, but include two concentric ridges: an inner ridge 26 and an outer ridge 28. The formation of these ridges, which occurs during etching, is not completely understood at present. The number of ridges formed may vary as will be discussed: pit 24 is termed a second generation pit because it has two ridges; pits formed with three ridges are termed third generation pits.

*Etching of N-type wafers*

Rapid etching of flat pits in N-type germanium wafers was heretofore successively performed under the following conditions with the apparatus aforedescribed. ("Rapid" may be defined as characterizing a material removal rate greater than 0.08 mil/sec. "Flat" is defined as linear within a tolerance of 0.01 mil for 6–8 mils in either horizontal direction. In addition to being flat the plane of bottom of the pit must also be substantially parallel with the plane of the wafer, i.e., perpendicular to the direction of the jet stream.) Light 22 was made intensely bright in order to generate sufficient charge carriers (holes) for etching since these are not normally present in N-type material in sufficient quantities to sustain rapid anodic etching. A 500 watt GE projector bulb, type DHJ, was used with a reflector and spaced about 6 inches from the pit. For electrolyte 16 was used a solution including sodium fluoride, sulfuric acid, and manganese sulfate.

Before discussing the magnitude of etching current 20, it is necessary to discuss the generation of the concentric ridges which are formed during etching. The second generation pit shown is formed with a particular value of current and enough light to produce more charge carriers than is necessary for the anodic removal of germanium at the surface of the wafer. Whenever the current is increased so that there is insufficient light, a second generation pit with a convex mound on the bottom will be formed; a further increase in current will form pits with a larger mound. As the current is increased still further a depression will be formed in the top of the mound, and for a yet further increase in current the depression will become larger. The mound will then lose its identity and its outer edge will form an annular cusp so that three concentric ridges and hence a bowl-bottomed third generation pit will be formed. A still further current increase will produce a third generation pit with the desired flat bottom. It is more desirable to etch in the third region than the second since the current level for the former produces fast etching, while the current level which produces a second generation pit is insufficient to provide rapid etching.

Still further current increases will produce a third generation pit with a mound in the center for the same fixed amount of incident light. Yet faster etching was not possible since arcing occurs when the current was increased beyond that required for third generation pits.

One theory regarding the formation of the mound on the bottom of the pit when an excess of current is present takes into account the hole supply in the wafer. It has been theorized that since the hole supply is less limited at the periphery of the pit than the center due to lateral diffusion of holes into the pit from the body of the wafer, a greater rate of removal of wafer material occurs in the annular peripheral area of the pit, leaving more material and hence a mound at the center of the pit. It has also been theorized that etching of a flat bottomed pit is possible when excess light is used because an excess of charge carriers are present which alleviates the normally high dependence of etch rate on current density.

The spacing from the mouth of jet 18 to the upper face of wafer 10 is not critical and was standardized at 0.1″ for convenience.

*Etching of P-type wafers*

The aforenoted process for etching N-type blanks was used successfully for some time. With the advent of the MADE (Micro Alloy Diffused Emitter) transistor, described on p. 108 of Electronics, Feb. 15, 1963, a need for rapidly etching pits in P-type germanium blanks arose. When P-type blanks were etched in accordance with the aforedescribed N-type procedures, a rapid etch rate was achieved but the production of flat-bottomed pits was impossible. Only pits with bowl shaped bottoms could be fabricated. It was only when the etch current was reduced to the second generation level that flat pits resulted. However the operation of an automated production line was impractical due to the slowness of the etch rate in the second generation region. Despite variation of all the normally critical parameters no way was found to rapidly etch flat-bottomed pits in P-type wafers.

I have discovered a way to anodically etch flat-bottomed pits in P-type germanium wafers at a rapid rate, i.e., 0.5 to 0.7 mil/sec., a speed which permits the etching of a typical wafer to be accomplished in only a few seconds.

The jet etching process of the invention utilizes the same high fast-etch current level which heretofore created third generation pits. Anomalously, however, this current level now creates only second generation pits when used in conjunction with the present process. This is a distinct advantage, since with all other factors equal, it is more desirable to etch in the second region than the third because the supply of holes and hence illumination level is critical in the third region but not in the second. This applies to both P- and N-type blanks; consequently the process of the invention is also highly advantageous when used to etch N- as well as P-type wafers.

*Process of invention*

The chemical composition of the electrolyte solution used according to the invention is a relatively dilute aqueous solution of sulfuric and hydrofluoric acids. Rapid etching of flat pits in germanium wafers was possible when the following approximate amount ranges of sulfuric and hydrofluoric acids were combined with enough water to fill an 18 liter carboy:

| | Ml. |
|---|---|
| $H_2SO_4$ (95% by wgt.) | 50 to 300 |
| HF (49% by wgt.) | 800 to 1000 |

These volumetric ranges are equivalent to the following approximate respective weight ranges of the three constituents in their pure chemical form:

| | Gm. |
|---|---|
| $H_2O$ | 17,620–17,300 |
| HF (100%) | 460–570 |
| $H_2SO_4$ (100%) | 90–520 |

Thus an electrolyte according to the invention includes from 1,730 to 1,762 parts water, from 46–57 parts HF, and from 9–52 parts $H_2SO_4$.

Although the above proportions of the electrolyte constituents are not highly critical, it was observed that rapid etching of flat-bottomed pits was not possible when the electrolyte constitutents did not fall substantially within the above ranges. Various problems noted with other proportions included bowl and mound bottomed pits, slow etch rates, burned pit shoulders, rings in the bottom of the pit, and "spikes" in the pit bottom. Within the ranges specified, the larger proportions of $H_2SO_4$ (which yield a more conductive solution), should be used in conjunction with jets having larger bores (20 mils) and wafers of higher resistivity in order to maintain pit flatness.

The jet-to-blank spacing, which was not critical in prior art jet etch processes, has been found to be critical with this solution. It can be easily adjusted empirically to the range wherein pit flatness is achieved, however. Too large a spacing will produce a bowl-shaped pit bottom, whereas too close a spacing will produce mound-shaped bottom. With an 18–20 mil diameter jet having approximately 0.1 inch (100 mils) of narrow bore length 30, the proper spacing produces a reading on voltmeter 32 of about 750 to 950 volts for an etching current of 160–200 ma. with a P-type germanium wafer having a resistivity of 0.1 to 0.5 ohm-cm. The minimum jet current density under these conditions is thus equal to the minimum jet current (160 ma.) divided by the area (314 mils$^2$) of the largest diameter jet (20 mils); this density is about .5 ma./mil$^2$ or $5\times10^{-4}$ a./in.$^2$. Since almost all the circuit resistance is present in the narrow bore region 30 and jet stream 16, almost all the voltage drop will be present across this part of the circuit. The voltage across source 20 as indicated by voltmeter 32 will thus indicate this drop irrespective of the location of electrode 34 in the tubing. Since the length of region 30 is fixed, variations in the reading of voltmeter 32 will be indicative of variations in the nozzle-to-blank spacing.

The jet pressure used must be sufficient to give a stable jet geometry. For 18 to 20 mil jets, 6.8 p.s.i. is desirable.

Electrolyte temperature should be approximately within room temperature range. Once the critical jet-to-blank spacing has been empirically adjusted as above-described, the temperature of the electrolyte should not be allowed to vary. It has been found desirable to provide a vernier, micrometer-type mechanism so that jet-to-blank spacing can be precisely readjusted to compensate for ambient temperature changes in the electrolyte as well as for lot-to-lot changes in wafer bulk resistivity.

A light source must be used even though P-type wafers are etched, since pit diameters will shrink and shoulder definition will degrade in absence of illumination. Of course when N-type wafers are etched intense illumination is essential due to the paucity of holes in N-type material. Illumination may be provided according to the procedure described in Patent 3,039,515.

Jet nozzle 18 should be fabricated of an inert, nonconductive material such as a fluorocarbon polymer.

The instant invention is not limited to the specificities of the foregoing description since modifications thereof which still fall within the true scope of the invention concept will be apparent to those conversant with the art. The invention is defined only by the appended claims.

I claim:

1. A process for rapidly etching a flat-bottomed pit in the face of a germanium wafer comprising: directing against said wafer from a nozzle spaced therefrom a jet of an electrolyte solution consisting essentially of about 1730 to 1762 parts $H_2O$, about 9 to 52 parts $H_2SO_4$, and about 46 to 57 parts HF, applying an etching voltage across said solution and said wafer sufficient to create a current density of at least about $5\times10^{-4}$ amperes per square inch in said jet, illuminating the face of said wafer being etched, and spacing said nozzle from said wafer a distance intermediate the respective distances which will provide bowl-bottomed and mound-bottomed etch pits.

2. The process of claim 1 wherein said electrolyte is supplied to said wafer through an inert nozzle having a bore substantially 18 to 20 mils in diameter and about 100 mils in length, said etching voltage is suppied a constant current source arranged to provide anodic etching and to supply from 160 to 200 milliamperes of current, said wafer is of P-type conductivity having a resistivity of from 0.1 to 0.5 ohm-cm., and the spacing from the mouth of said nozzle to the face of said wafer is such that the voltage drop across the bore length of said nozzle and said jet is substantially from 750 to 950 volts.

3. In the jet etching process of the type wherein an inert nozzle supplying a jet of electrolyte is directed against the face of a germanium wafer with an etching voltage being applied across said wafer and the source of electrolyte supplying said nozzle, the method of effecting rapid etching of flat-bottomed pits in said wafer, comprising: illuminating the face of said wafer being etched, using for said electrolyte a solution consisting essentially of about 1730 to 1762 parts water, about 46 to 57 parts HF, and about 9 to 52 parts $H_2SO_4$, adjusting said etching voltage to create a current density of at least $5\times10^{-4}$ amperes per square inch in said jet, and spacing said nozzle from said wafer by a distance intermediate the respective distances which will provide bowl-bottomed and mound-bottomed etch pits.

4. The method of claim 3 wherein said nozzle has a circular bore of from 18 to 20 mils in diameter, said wafer has a resistivity of from 0.1 to 0.5 ohm-cm., said etching voltage is supplied from a presettable constant current source arranged to provide anodic etching and to supply from 160 to 200 milliamperes of current, and the spacing between the mouth of said nozzle and the face of said wafer is adjusted so that the voltage drop across the electrolyte in said bore and said jet is substantially from 750 to 950 volts.

References Cited by the Examiner

UNITED STATES PATENTS

| | | | |
|---|---|---|---|
| 2,844,531 | 7/1958 | Prince | 204—143 |
| 2,850,444 | 9/1958 | Armstrong et al. | 204—143 |
| 2,854,387 | 9/1958 | Zimmerman | 204—15 |
| 2,998,362 | 8/1961 | Hall | 204—143 |
| 3,188,284 | 6/1965 | Flinn et al. | 204—143 |

JOHN H. MACK, *Primary Examiner.*

R. MIHALEK, *Assistant Examiner.*